(12) United States Patent
Lavitsky et al.

(10) Patent No.: US 10,998,172 B2
(45) Date of Patent: May 4, 2021

(54) SUBSTRATE PROCESSING CHAMBER HAVING IMPROVED PROCESS VOLUME SEALING

(71) Applicant: APPLIED MATERIALS, INC., Santa Clara, CA (US)

(72) Inventors: Ilya Lavitsky, San Francisco, CA (US); Keith A. Miller, Mountain View, CA (US); John Mazzocco, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 165 days.

(21) Appl. No.: 16/132,962

(22) Filed: Sep. 17, 2018

(65) Prior Publication Data

US 2019/0096638 A1 Mar. 28, 2019

Related U.S. Application Data

(60) Provisional application No. 62/562,326, filed on Sep. 22, 2017.

(51) Int. Cl.
*H01J 37/32* (2006.01)
*C23C 14/54* (2006.01)
(Continued)

(52) U.S. Cl.
CPC ........ *H01J 37/32513* (2013.01); *C23C 14/34* (2013.01); *C23C 14/351* (2013.01);
(Continued)

(58) Field of Classification Search
USPC ........................................................ 118/733
See application file for complete search history.

(56) References Cited

U.S. PATENT DOCUMENTS 9,177,763 B2  11/2015 Rasheed et al.
2007/0212484 A1*  9/2007 Li .................... C23C 16/4412
427/248.1
(Continued)

FOREIGN PATENT DOCUMENTS

WO  WO 2013/162992 A1  10/2013

OTHER PUBLICATIONS

International Search Report and Written Opinion dated Jan. 9, 2019 for PCT Application No. PCT/US2018/051415.

*Primary Examiner* — Ram N Kackar
(74) *Attorney, Agent, or Firm* — Moser Taboada (57) ABSTRACT

Embodiments of process chambers are provided herein. In some embodiments, a process chamber includes: a chamber wall defining an inner volume within the process chamber; a substrate support disposed in the inner volume having a support surface to support a substrate, wherein the inner volume includes a processing volume disposed above the support surface and a non-processing volume disposed at least partially below the support surface; a gas supply plenum fluidly coupled to the processing volume via a gas supply channel disposed above the support surface; a pumping plenum fluidly coupled to the processing volume via an exhaust channel disposed above the support surface; and a sealing apparatus configured to fluidly isolate the processing volume from the non-processing volume when the substrate support is in a processing position, wherein the processing volume and the non-processing volume are fluidly coupled when the substrate support is in a non-processing position.

17 Claims, 4 Drawing Sheets

(51) Int. Cl.
 *C23C 14/56* (2006.01)
 *C23C 14/35* (2006.01)
 *C23C 14/50* (2006.01)
 *C23C 14/34* (2006.01)

(52) U.S. Cl.
 CPC .............. *C23C 14/50* (2013.01); *C23C 14/54* (2013.01); *C23C 14/564* (2013.01); *H01J 37/32449* (2013.01); *H01J 37/32651* (2013.01); *H01J 37/32834* (2013.01)

(56) References Cited

U.S. PATENT DOCUMENTS

| | | |
|---|---|---|
| 2008/0257263 A1 | 10/2008 | Pavloff et al. |
| 2009/0314309 A1* | 12/2009 | Sankarakrishnan ........................ C23C 16/4409 134/1.1 |
| 2010/0055298 A1 | 3/2010 | Sommers et al. |
| 2010/0086805 A1 | 4/2010 | Lin et al. |
| 2014/0261182 A1 | 9/2014 | Nakazawa et al. |
| 2016/0079101 A1 | 3/2016 | Yanai et al. |

\* cited by examiner

FIG. 3B and the substrate. A non-processing or common volume is defined by the chamber floor, the chamber walls, and the bottoms of the substrate support and process kit shield. The inventors have discovered that because pumping, gas delivery, and pressure control typically occur in the non-processing volume, the majority of delivered gas is pumped out without being used because the non-processing volume is significantly large. In addition, pressure gauges are typically fluidly coupled to the non-processing volume, which may result in inaccurate readings of the pressure in the processing volume.

SUBSTRATE PROCESSING CHAMBER HAVING IMPROVED PROCESS VOLUME SEALING

CROSS-REFERENCE TO RELATED APPLICATIONS

This application claims benefit of U.S. provisional patent application Ser. No. 62/562,326, filed Sep. 22, 2017, which is herein incorporated by reference in its entirety.

FIELD

Embodiments of the present disclosure generally relate to substrate processing equipment.

BACKGROUND

To process a substrate using, for example, a physical vapor deposition (PVD) chamber, the substrate is transferred to a substrate support of the processing chamber via a robotic arm, the substrate support is raised to a processing position, and the process (e.g., deposition, etching, etc.). In a PVD chamber, a processing volume is defined by a process kit disposed in the processing chamber, a sputtering target, and the substrate. A non-processing or common volume is defined by the chamber floor, the chamber walls, and the bottoms of the substrate support and process kit shield. The inventors have discovered that because pumping, gas delivery, and pressure control typically occur in the non-processing volume, the majority of delivered gas is pumped out without being used because the non-processing volume is significantly large. In addition, pressure gauges are typically fluidly coupled to the non-processing volume, which may result in inaccurate readings of the pressure in the processing volume.

Accordingly, the inventors have provided embodiments of improved substrate process chamber.

SUMMARY

Embodiments of process chambers are provided herein. In some embodiments, a process chamber, includes: a chamber wall defining an inner volume within the process chamber; a substrate support disposed in the inner volume having a support surface to support a substrate, wherein the inner volume includes a processing volume disposed above the support surface and a non-processing volume disposed at least partially below the support surface; a gas supply plenum fluidly coupled to the processing volume via a gas supply channel disposed above the support surface; a pumping plenum fluidly coupled to the processing volume via an exhaust channel disposed above the support surface; and a sealing apparatus configured to fluidly isolate the processing volume from the non-processing volume when the substrate support is in a processing position, wherein the processing volume and the non-processing volume are fluidly coupled when the substrate support is in a non-processing position.

In some embodiments, a process chamber includes: a chamber wall defining an inner volume within the process chamber, wherein the inner volume includes a processing volume and a non-processing volume; a sputtering target disposed in an upper section of the inner volume; a substrate support having a support surface to support a substrate below the sputtering target; a sealing apparatus coupled to the substrate support and configured to fluidly isolate the processing volume from the non-processing volume when the substrate support is in a processing position; and a process kit. In some embodiments, the process kit includes: an annular adapter disposed atop the chamber wall and having a first annular channel and a second annular channel; a lower shield having an outwardly extending collar disposed atop a portion of the annular adapter and adjacent the first annular channel to form a first annular plenum, wherein the lower shield includes a plurality of through holes formed through the collar to fluidly couple the first annular plenum to the processing volume; and an upper shield having an upper portion disposed atop the outwardly extending collar and a lower portion extending downward from the upper portion, wherein the upper portion includes a third annular channel formed in an outer surface of the upper portion and disposed adjacent the second annular channel to form a second annular plenum, and wherein the upper portion is spaced apart from the sputtering target to form a tortuous path between the upper portion and the sputtering target fluidly coupling the second annular plenum to the processing volume.

In some embodiments, a process chamber includes a chamber wall defining an inner volume within the process chamber, wherein the inner volume includes a processing volume and a non-processing volume; a process kit having a gas supply plenum and a pumping plenum both of which are fluidly coupled to the inner volume; a substrate support having a support surface to support a substrate; and a sealing member configured to selectively seal against the process kit to fluidly isolate the processing volume from the non-processing volume as the substrate support moves between a first position and a second position lower than the first position.

In some embodiments, a process chamber includes: a chamber wall defining an inner volume within the process chamber; a first substrate support having a first support surface and a second substrate support having a second support surface each disposed in the inner volume, wherein the inner volume includes a first processing volume disposed above the first substrate support and a first non-processing volume disposed at least partially below the first support surface, wherein the inner volume includes a second processing volume disposed above the second substrate support and a second non-processing volume disposed at least partially below the second support surface, and wherein the first non-processing volume and the second non-processing volume together form a common volume; a first gas supply plenum fluidly coupled to the first processing volume via a first gas supply channel disposed above the first support surface; a second gas supply plenum fluidly coupled to second the processing volume via a second gas supply channel disposed above the second support surface; a first pumping plenum fluidly coupled to the first processing volume via a first exhaust channel disposed above the first support surface; a second pumping plenum fluidly coupled to the second processing volume via a second exhaust channel disposed above the second support surface; and a first sealing apparatus configured to fluidly isolate the first processing volume from the common volume when the first substrate support is in a processing position, wherein the first processing volume and the common volume are fluidly coupled when the first substrate support is in a non-processing position; and a second sealing apparatus configured to fluidly isolate the second processing volume from the common volume when the second substrate support is in a processing position, wherein the second processing volume and the common volume are fluidly coupled when the second substrate support is in a non-processing position.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of process chambers are provided herein. In some embodiments, a process chamber includes a gas supply system and a pumping system fluidly coupled to the processing volume of the process chamber. The inventive process chamber, thus, advantageously reduces the time required for pumping the process chamber down to a process pressure and for supplying process gases to the chamber by reducing the volume in which pumping and gas supply takes place. In some embodiments, the process chamber further includes a sealing apparatus that seals off the processing volume during processing of a substrate to seal off the non-processing volume of the process chamber from the processing volume. As a result, the process chamber may be part of a cluster tool having a plurality of process chambers running the same or different processes since the processing volumes of each of the plurality of chambers are fluidly independent of each other.

Figure 1:
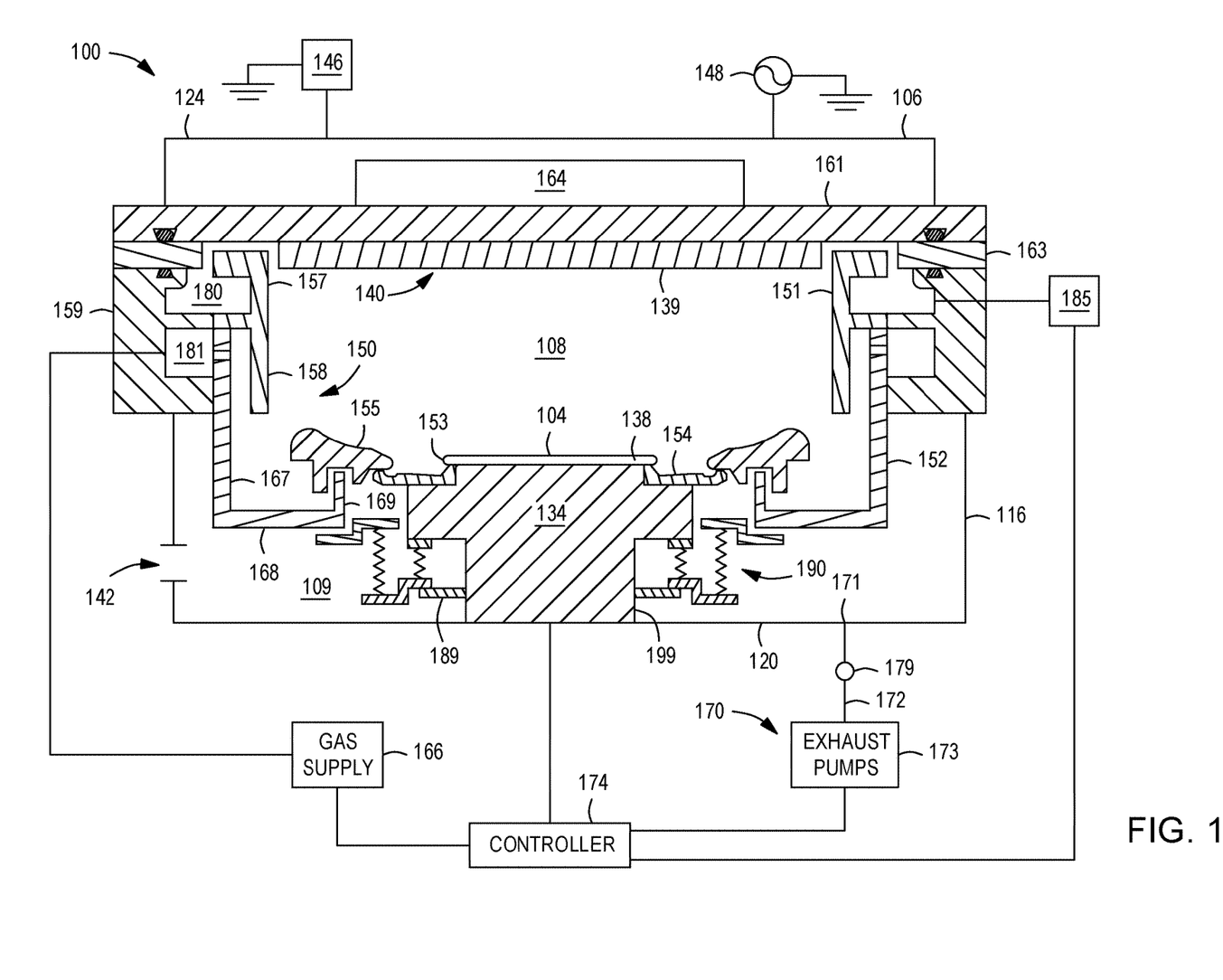
FIG. 1 depicts a schematic cross sectional view of a process chamber in accordance with some embodiments of the present disclosure.

FIG. 1 depicts a schematic, cross-sectional view of an illustrative process chamber 100 (e.g., a PVD chamber) having a process kit shield in accordance with some embodiments of the present disclosure. Examples of PVD chambers suitable for use with process kit shields of the present disclosure include the IMPULSE™ and other PVD processing chambers commercially available from Applied Materials, Inc., of Santa Clara, Calif. Other processing chambers from Applied Materials, Inc. or other manufactures may also benefit from the inventive apparatus disclosed herein.

The process chamber 100 comprises chamber walls 106 that enclose an inner volume having a processing volume 108 and a non-processing volume 109. The chamber walls 106 include sidewalls 116, a bottom wall 120, and a ceiling 124. The ceiling 124 may be a chamber lid or a similar cover to seal off the inner volume. The process chamber 100 can be a standalone chamber or a part of a multi-chamber platform (not shown) such as for example, any of the ENDURA®, CENTURA®, or PRODUCER® lines of process systems having a cluster of interconnected chambers connected by a substrate transfer mechanism that transfers substrates 104 between the various chambers (e.g., a substrate transfer robot). The process chamber 100 may be a PVD chamber capable of sputter depositing material onto a substrate 104. Non-limiting examples of suitable materials for sputter deposition include one or more of aluminum, copper, tantalum, tantalum nitride, titanium, titanium nitride, tungsten, tungsten nitride, and the like.

The process chamber 100 comprises a substrate support 130 which comprises a pedestal 134 to support the substrate 104. The pedestal 134 has a substrate support surface 138 having a plane substantially parallel to a sputtering surface 139 of a sputtering target 140 disposed in an upper section of the process chamber 100. The substrate support surface 138 of the pedestal 134 receives and supports the substrate 104 during processing. The pedestal 134 may include an electrostatic chuck or a heater (such as an electrical resistance heater, heat exchanger, or other suitable heating device). In operation, a substrate 104 is introduced into the non-processing volume 109 of the process chamber 100 through a substrate loading inlet 142 in the sidewall 116 of the process chamber 100 and placed onto the substrate support 130, which is in a non-processing position during loading of the substrate 104. The substrate support 130 can be lifted or lowered by a support lift mechanism and a lift finger assembly can be used to lift and lower the substrate 104 onto the substrate support 130 during placement of the substrate 104 on the substrate support 130 by a robot arm. The pedestal 134 can be maintained at an electrically floating potential or grounded during plasma operation.

The process chamber 100 also contains a process kit 150, which comprises various components that can be easily removed from the process chamber 100, for example, to clean sputtering deposits off the component surfaces, replace or repair eroded components, or to adapt the process chamber 100 for other processes. The inventors have discovered that by incorporating the gas supply and pumping mechanisms into the process kit, throughput can be increased since only the processing volume is pumped down and receives process gases, thus reducing the amount of time required to do both.

Figure 2A:
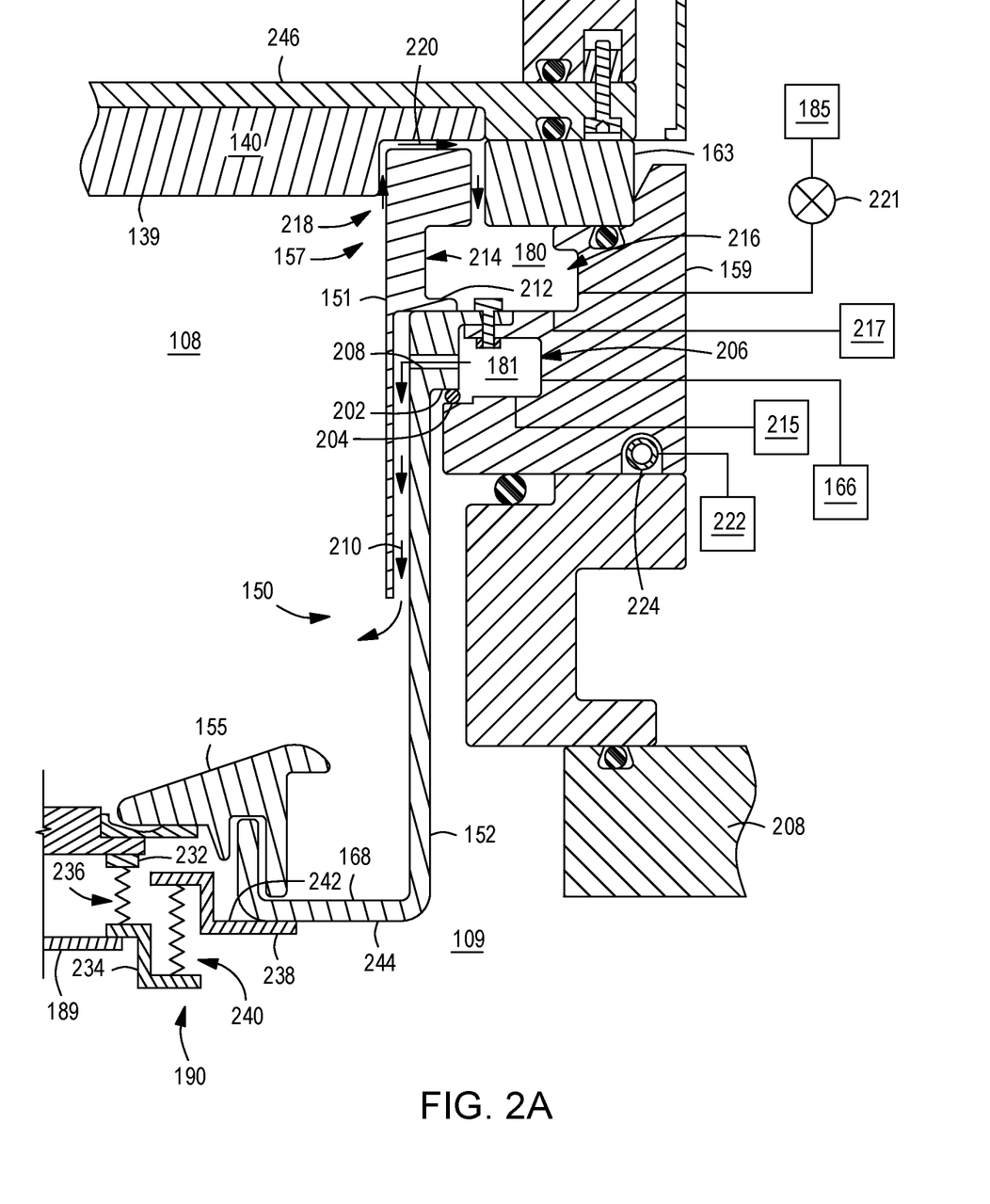
FIGS. 2A and 2B depict schematic cross sectional zoomed views of a process chamber in accordance with some embodiments of the present disclosure.
Figure 2B:
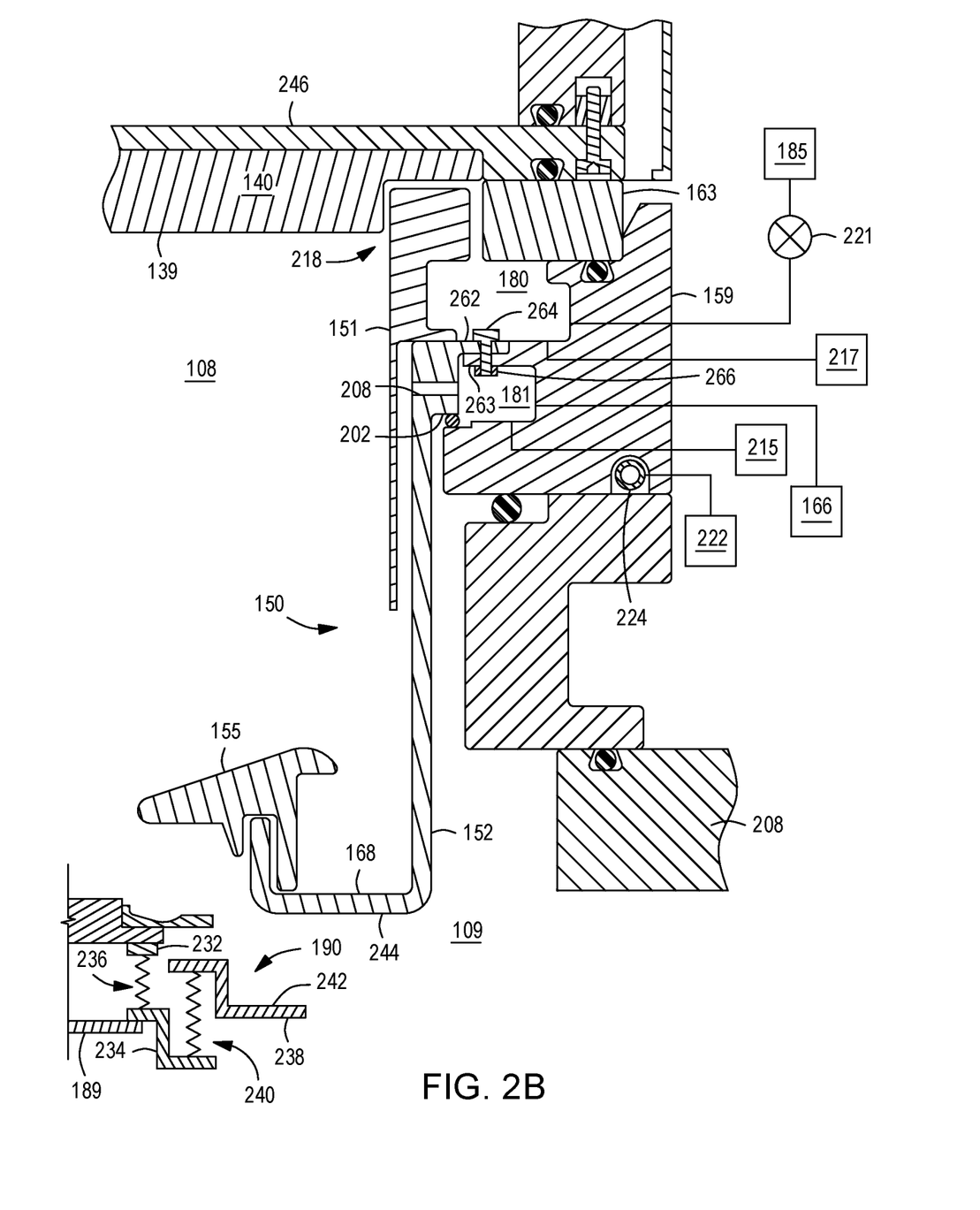

For example, the process chamber 100 can include a gas supply plenum fluidly coupled to the processing volume 108 via a gas supply channel (discussed in more detail in FIGS. 2A-2B). The gas supply plenum is coupled to a gas supply 166 to receive one or more process gases to be supplied to the processing volume 108 during processing. In addition, the process chamber 100 can include a pumping plenum fluidly coupled to the processing volume 108 via an exhaust channel (discussed in more detail in FIGS. 2A-2B). The pumping plenum is coupled to a pump 185 to evacuate the processing volume 108.

In some embodiments, the process kit 150 includes an upper shield 151 and a lower shield 152. The upper shield has a diameter sized to encircle the sputtering surface 139 of the sputtering target 140 and the substrate support 130 (e.g., a diameter larger than the sputtering surface 139 and larger than the support surface of the substrate support 130). As will be described in more detail below with respect to FIGS. 2A and 2B, the upper shield has an upper portion 157 disposed atop the lower shield 152 and a lower portion 158 that extends downward from the upper portion and vertically overlaps at least a portion of the lower shield 152 in a spaced apart relation to a radially inner surface of the lower shield 152 (e.g., defining a gap between the lower portion 158 and the lower shield 152). The lower shield 152 includes a cylindrical portion 167, a ledge 168 extending radially inward from a bottom portion of the cylindrical portion 167, and a lip 169 extending upward from a radially innermost portion of the ledge 168 and surrounding the substrate support 130. Although the upper shield 151 and the lower shield 152 are depicted as being separate elements, in some embodiments, the upper shield 151 and the lower shield 152 may be formed as one unitary structure. The upper shield 151 and the lower shield 152 may be formed of the same material or different materials such as, for example, an aluminum alloy, stainless steel, or a ceramic.

The upper portion 157 of the upper shield 151 and the upper portion of the cylindrical portion 167 interface with the annular adapter 159 to form a first annular plenum 180 and a second annular plenum 181, respectively, both of which are fluidly coupled to the processing volume 108. The first annular plenum 180 can be the pumping plenum, fluidly coupled to the pump 185 such as, for example, a turbomolecular pump to evacuate the processing volume 108. The second annular plenum 181 can be the gas supply plenum, fluidly coupled to the gas supply 166 to receive one or more process gases to be supplied to the processing volume 108 during processing.

The process kit 150 further comprises a cover ring 155 disposed atop the lip 169 and a deposition ring 154 disposed below the cover ring 155. A bottom surface of the cover ring 155 interfaces with the deposition ring 154. The cover ring 155 at least partially covers the deposition ring 154. The deposition ring 154 and cover ring 155 cooperate with one another to reduce formation of sputter deposits on the peripheral walls of the substrate support 130 and an overhanging edge 153 of the substrate 104.

The process chamber 100 further comprises a sealing apparatus 190 coupled to the pedestal 134 to seal off the processing volume 108 from the non-processing volume 109 when the pedestal 134 is in a processing position. The sealing apparatus 190 is configured to selectively seal the processing volume 108 from the non-processing volume 109 when the pedestal 134 is in a processing position, while allowing the processing volume 108 and the non-processing volume 109 to be fluidly coupled when the pedestal 134 is in a non-processing position, for example, when in a lowered, loading position. In some embodiments, the sealing apparatus 190 can include at least one bellows coupled to the substrate support 130 at a first end and to a radially outward portion of an annular bracket at a second end opposite the first end, wherein, when the substrate support is in the processing position, an upper surface of a radially outward portion of the annular bracket is disposed against a surface of a process chamber component (such as the lower shield 152) to seal, or fluidly decouple, the processing volume 108 from the non-processing volume 109. When the substrate support 130 is in the non-processing position, the upper surface of the annular bracket is spaced apart from the surface of the process chamber component such that the processing volume 108 is fluidly coupled to the non-processing volume 109.

FIGS. 2A, B depict a schematic cross-sectional zoomed in view of a right side of the process chamber 100 in accordance with some embodiments of the present disclosure. FIG. 2A depicts the pedestal 134 in a processing position. FIG. 2B depicts the pedestal 134 in a lower position (i.e., in the process of being lowered to a loading position in which the substrate 104 is placed on the substrate support 130). As shown in FIGS. 2A, B, the lower shield 152 includes a outwardly extending collar 202 disposed atop a portion of the annular adapter 159. The collar 202 together with a first annular channel 206 formed in the annular adapter 159 form the second annular plenum 181. An o-ring 204 may be disposed between the collar 202 and the annular adapter 159 to provide an improved seal between the second annular plenum 181 and the non-processing volume 109. In some embodiments, the an outwardly extending ledge 262 (labeled only in FIG. 2B for clarity) may extend from an upper portion of the collar 202. The outwardly extending ledge 262 is disposed atop an inwardly extending ledge 263 of the annular adapter 159. One or more fixation elements may be used to clamp down the outwardly extending ledge 262 onto the inwardly extending ledge 263. For example, the fixation elements may include a bolt 264 and a nut 266. However, other fixation elements may alternatively be used.

A plurality of through holes 208 are formed through the collar 202 to fluidly couple the second annular plenum 181 with the processing volume 108 (e.g., to form a gas supply channel for gas supplied to the second annular plenum 181 to flow to the processing volume 108). The resultant flow path is depicted by arrows 210 shown in FIG. 1A. In some embodiments, the plurality of through holes 208 may include between about 10 and about 50 through holes. In some embodiments, the plurality of through holes 208 may alternatively include about 16 through holes. In some embodiments, the plurality of through holes 208 may each have the same diameter. In some embodiments, the plurality of through holes 208 may alternatively have different diameters to control the flow conductance of process gas from the second annular plenum 181 into the processing volume 108. In some embodiments, a first pressure monitoring device 215 (e.g., a pressure gauge) may be fluidly coupled to the second annular plenum 181 to monitor a first pressure within the second annular plenum 181.

In some embodiments, the upper portion 157 of the upper shield 151 includes a second annular channel 214 formed in an outer and an outwardly extending annular ledge 212 that rests atop the collar 202 of the lower shield 152. The second annular channel 214 together with a third annular channel 216 formed in the annular adapter 159 form the first annular plenum 180 (e.g., a pumping plenum). The upper portion 157 is spaced apart from the sputtering target 140 such that a tortuous path 218 (shown in FIG. 2B) is formed between the sputtering target 140 and the upper portion 157 of the upper shield 151. The tortuous path 218 provides an exhaust channel that fluidly couples the processing volume 108 with the first annular plenum 180. The resultant flow path of evacuated gas is depicted by arrows 220. In some embodiments, a valve 221 may be coupled to the pump 185 between the first annular plenum 180 and the pump 185 to selectively fluidly couple the first annular plenum 180 with the pump 185. In some embodiments, a second pressure monitoring device 217 (e.g., a pressure gauge) may be fluidly coupled to the first annular plenum 180 to monitor a second pressure within the first annular plenum 180.

In some embodiments, a heat transfer source 222 may be coupled to an annular tube 224 disposed in the annular adapter 159 to supply a heat transfer medium (e.g., a coolant) to the annular tube 224 control the temperature of the annular adapter 159. In some embodiments, an insulator ring 163 may be disposed between a backing plate 246 of the sputtering target 140 and the annular adapter 159 to electrically insulate the annular adapter 159 and chamber walls from the backing plate 246.

Referring to FIGS. 1, and 2A-2B, the process chamber 100 further includes the sealing apparatus 190 coupled to the pedestal 134 via a base plate 189 that is coupled to the pedestal 134. The base plate 189 is coupled to a shaft 199 of the substrate support 130 at a center of the base plate 189. The sealing apparatus 190 is configured to fluidly isolate the processing volume 108 from the non-processing volume 109 during processing of the substrate 104 so that pumping down to a process pressure and process gas delivery only occurs in the process volume 108. As a result, the throughput of the process chamber 100 is improved due to the reduced time required to pump down and deliver gas to just the processing volume 108 instead of both the processing volume 108 and the non-processing volume 109.

In some embodiments, the sealing apparatus 190 includes a ring 232 coupled to a bottom surface of the substrate support 130, a first annular bracket 234 coupled to the ring 232 via a first bellows 236, and a second annular bracket 238 coupled to the first annular bracket 234 via a second bellows 240. The first bellows 236 is coupled to the ring 232 at a first end and to a radially inward portion of the first annular bracket 234 at a second end. The second bellows 240 is coupled to a radially outward portion of the first annular bracket 234 at a first end and to the second annular bracket 238 at a second end. The base plate 189 is coupled to the radially inward portion of the first annular bracket 234 on a side opposite the first bellows 236.

In the pedestal position depicted in FIG. 2A, the second bellows 240 is in a compressed state and an upper surface 242 of a radially outward portion of the second annular bracket 238 abuts against a lower surface 244 of the ledge 168 of the lower shield 152. In the pedestal position depicted in FIG. 2B (i.e., en route to a lowermost loading position of the pedestal 134), the second bellows 240 is in an uncompressed state and the upper surface 242 of the second annular bracket 238 is spaced apart from the lower surface 244 of the of the lower shield. Because the first bellows 236 does not move between a compressed state or an uncompressed state in a similar manner as the second bellows 240, in some embodiments, a solid structure (e.g., a wall) may connect the ring 232 and the first annular bracket 234. In some embodiments, the sealing apparatus 190 may only include the second bellows 240.

Figure 3A:
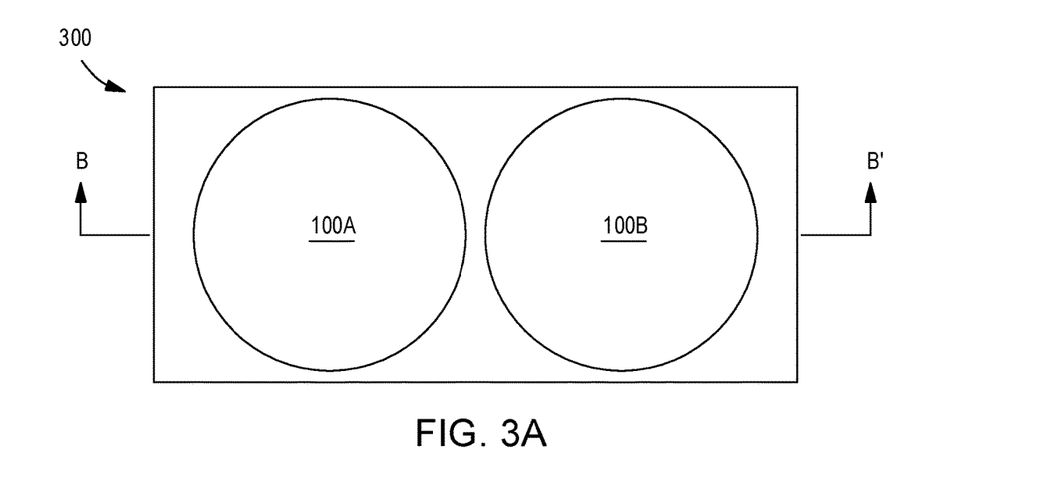
FIG. 3A illustrates a top schematic view of a multi-chamber cluster tool 300 in accordance with some embodiments of the present disclosure.
Figure 3B:
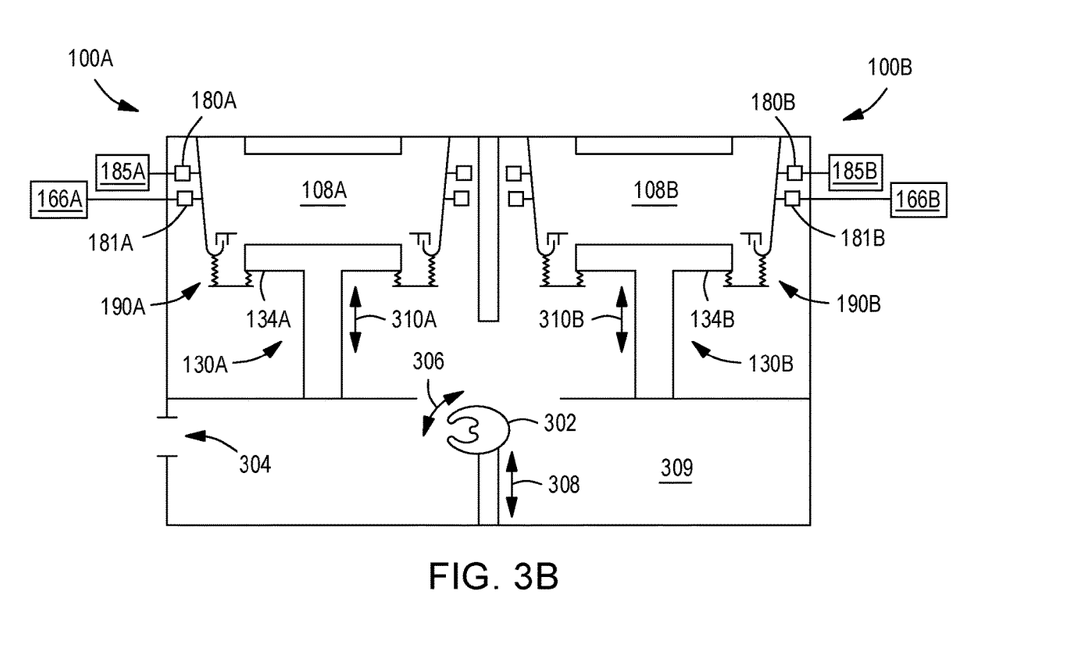
FIG. 3B illustrates a schematic cross-sectional view of the multi-chamber cluster tool of FIG. 3A taken along line B-B'.

A further advantage of the sealing apparatus 190 and process kit 150 of the process chamber 100 disclosed herein is realized in a scenario in which the process chamber 100 is one of a plurality of chambers of a multi-chamber cluster tool. In such a scenario each chamber can run different processes or the same process due to the isolation of the processing volume of each process chamber. For example, FIG. 3A illustrates a top schematic view of a multi-chamber cluster tool 300 in accordance with some embodiments of the present disclosure. FIG. 3B illustrates a schematic cross-sectional view of the multi-chamber cluster tool of FIG. 3A taken along line B-B'. As illustrated in FIGS. 3A, B, the multi-chamber cluster tool 300 may include a plurality of process chambers 100A, 100B. Although two chambers are shown in FIGS. 3A, B, the multi-chamber cluster tool 300 may alternatively include any number of chambers (e.g., three, four, etc.) Each chamber may be similar to the process chamber 100 described above. In some embodiments, the multi-chamber cluster tool 300 includes a robotic arm 302 configured to receive a substrate from a transfer robot (not shown) through an opening 304 (e.g., a slit valve opening). The robotic arm 302 can rotate (as shown by arrow 306) and move vertically (as shown by arrow 308) to supply a substrate to the process chambers 100A, 100B. The process chambers 100A, 100B include respective substrate supports 130A, 130B (e.g., a first substrate support and a second substrate support) having pedestals 134A, 134B similar to the substrate support 130 and pedestal 134 described above. The pedestals 134A, 134B are vertically moveable (as shown by arrows 310A, 310B) between respective loading positions to receive a substrate from the robotic arm 302 and processing positions to process a substrate disposed atop the respective pedestal. Because each process chamber 100A, 100B includes the sealing apparatus 190 described above (e.g., 190A, 190B), the respective processing volumes 108A, 108B are isolated from a common volume 309 (e.g., the non-processing volumes disposed beneath the pedestals) when the pedestals 134A, B are in the processing positions. As such, the process chambers 100A, 100B may advantageously run different processes without one chamber's process contaminating an adjacent chamber.

For example, each process chamber 100A, 100B can be coupled to an independent gas supply 166A, 166B via respective gas supply plenums (e.g., second annular plenums 181A, 181B). In addition, each process chamber 100A, 100B can be coupled to an independent pump 185A, 185B via respective pumping plenums (e.g., first annular plenums 180A, 180B). Alternatively, each process chamber 100A, 100B can be coupled to a common pump 185, with individually controlled valves to control the pumping from each respective processing volume 108A, 108B.

Returning to FIG. 1, the sputtering target 140 is connected to one or both of a DC power source 146 and an RF power source 148. The DC power source 149 can apply a bias voltage to the sputtering target 140 relative to the upper shield 151, which may be electrically floating during a sputtering process. While the DC power source 146 supplies power to the sputtering target 140, the upper shield 151, the substrate support 130, and other chamber components connected to the DC power source 146, the RF power source 148 energizes the sputtering gas to form a plasma of the sputtering gas. The plasma formed impinges upon and bombards the sputtering surface 139 of the sputtering target 140 to sputter material off the sputtering surface 139 onto the substrate 104. In some embodiments, RF energy supplied by the RF power source 148 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies.

In some embodiments, the process chamber 100 may include a magnetic field generator 164 disposed above the sputtering target 140 to shape a magnetic field about the sputtering target 140 to improve sputtering of the sputtering target 140. The capacitively generated plasma may be enhanced by a magnetic field generator 164 in which for example, a permanent magnet or electromagnetic coils may provide a magnetic field in the process chamber 100 that has a rotating magnetic field having a rotational axis that is perpendicular to the plane of the substrate 104. The process chamber 100 may, in addition or alternatively, comprise a magnetic field generator 164 that generates a magnetic field near the sputtering target 140 of the process chamber 100 to increase an ion density in a high-density plasma region adjacent to the sputtering target 140 to improve the sputtering of the target material.

In some embodiments, the process chamber 100 may additionally include an exhaust 170. The exhaust 170 comprises an exhaust port 171 that may receive some spent process gas and passes the spent gas to an exhaust conduit 172 having a throttle valve 179 to control a pressure of the gas in the process chamber 100. The exhaust conduit 172 is connected to one or more exhaust pumps 173.

Various components of the process chamber 100 may be controlled by a controller 174. The controller 174 comprises program code having instruction sets to operate the components to process a substrate 104. For example, the controller 174 can comprise program code that includes substrate positioning instruction sets to operate the substrate support 130 and substrate transfer mechanism; gas flow control instruction sets to operate gas flow control valves to set a flow of sputtering gas to the process chamber 100; gas pressure control instruction sets to operate the maintain a pressure in the process chamber 100; gas energizer control instruction sets to operate the RF power source 148 to set a gas energizing power level; temperature control instruction sets to control a temperature control system in the substrate support 130 or the heat transfer source 222 to control a flowrate of the heat transfer medium to the annular tube 224; and process monitoring instruction sets to monitor the process in the process chamber 100.

While the foregoing is directed to embodiments of the present disclosure, other and further embodiments of the disclosure may be devised without departing from the basic scope thereof.

The invention claimed is:

1. A process chamber, comprising:
   a chamber wall defining an inner volume within the process chamber;
   a substrate support disposed in the inner volume having a support surface to support a substrate, wherein the inner volume includes a processing volume disposed above the support surface and a non-processing volume disposed at least partially below the support surface;
   a gas supply plenum fluidly coupled to the processing volume via a gas supply channel disposed above the support surface;
   a pumping plenum fluidly coupled to the processing volume via an exhaust channel disposed above the support surface;
   a process kit disposed within the inner volume and surrounding the processing volume, wherein the process kit comprises:
      a lower shield at least partially defining a first annular plenum radially outward of an inner sidewall of the lower shield and having a plurality of through holes formed through an upper portion of the lower shield that together with the annular plenum at least partially define the gas supply channel; and
      an upper shield at least partially defining a second annular plenum radially outward of an inner sidewall of the upper shield and disposed atop the lower shield, wherein the upper shield includes an upper portion that partially defines the exhaust channel; and
   a sealing apparatus configured to fluidly isolate the processing volume from the non-processing volume when the substrate support is in a processing position, wherein the processing volume and the non-processing volume are fluidly coupled when the substrate support is in a non-processing position.

2. The process chamber of claim 1, wherein the upper shield further includes a lower portion extending downward from the upper portion in a spaced apart relation to a radially inner surface of the lower shield to define a gap between the lower portion and the radially inner surface, wherein the plurality of through holes of the lower shield are disposed adjacent to the lower portion of the upper shield such that the gap further at least partially defines the gas supply channel.

3. The process chamber of claim 1, wherein the process kit further comprises:
   a cover ring disposed atop an upwardly extending lip of the lower shield; and
   a deposition ring disposed atop the substrate support and beneath the cover ring.

4. The process chamber of claim 1, wherein the process kit further comprises:
   an annular adapter disposed atop the chamber wall and having a first annular channel and a second annular channel disposed along a radially inward facing surface of the annular adapter;
   wherein the lower shield includes an outwardly extending collar disposed atop a portion of the annular adapter and adjacent the first annular channel to form the first annular plenum; and
   wherein the upper shield includes an upper portion disposed atop the outwardly extending collar and a lower portion extending downward from the upper portion, wherein the upper portion includes a third annular channel formed in an outer surface of the upper portion and disposed adjacent the second annular channel to form the second annular plenum, and wherein the upper portion at least partially defines a tortuous path fluidly coupling the second annular plenum to the processing volume.

5. The process chamber of claim 1, wherein the sealing apparatus comprises:
   a bellows coupled to the substrate support at a first end and to a radially outward portion of an annular bracket at a second end opposite the first end, wherein, when the substrate support is in the processing position, an upper surface of a radially outward portion of the annular bracket is disposed against a surface of a process chamber component to fluidly decouple the processing volume from the non-processing volume, and wherein, when the substrate support is in the non-processing position, the upper surface of the annular bracket is spaced apart from the surface of the process chamber component to fluidly couple the processing volume to the non-processing volume.

6. The process chamber of claim 1, further comprising:
   a first pressure monitoring device fluidly coupled to the gas supply plenum to monitor a first pressure within the gas supply plenum; and
   a second pressure monitoring device fluidly coupled to the pumping plenum to monitor a second pressure within the pumping plenum.

7. The process chamber of claim 1, further comprising:
   a gas supply coupled to the gas supply plenum to supply one or more process gases to the processing volume; and
   a pump coupled to the pumping plenum to evacuate the processing volume.

8. The process chamber of claim 1, further comprising:
   a second substrate support disposed in the inner volume having a second support surface to support a second substrate, wherein the inner volume further includes a second processing volume disposed above the second support surface and a second non-processing volume disposed at least partially below the second support surface, wherein the non-processing volume and the second non-processing volume form a common volume;

a second gas supply plenum fluidly coupled to second the processing volume via a second gas supply channel disposed above the second support surface;

a second pumping plenum fluidly coupled to the second processing volume via a second exhaust channel disposed above the second support surface; and a second sealing apparatus configured to fluidly isolate the second processing volume from the common volume when the second substrate support is in a processing position, wherein the second processing volume and the common volume are fluidly coupled when the second substrate support is in a non-processing position.

9. The process chamber of claim 8, further comprising: a robotic arm disposed in the common volume to receive substrates through an opening in the chamber wall.

10. A process chamber, comprising:

a chamber wall defining an inner volume within the process chamber;

a substrate support disposed in the inner volume having a support surface to support a substrate, wherein the inner volume includes a processing volume disposed above the support surface and a non-processing volume disposed at least partially below the support surface;

a sputtering target disposed in an upper section of the inner volume adjacent the processing volume;

a gas supply plenum fluidly coupled to the processing volume via a gas supply channel disposed above the support surface;

an annular pumping plenum surrounding and fluidly coupled to the processing volume via an exhaust channel disposed above the support surface; and a sealing apparatus configured to fluidly isolate the processing volume from the non-processing volume when the substrate support is in a processing position, wherein the processing volume and the non-processing volume are fluidly coupled when the substrate support is in a non-processing position.

11. A process chamber, comprising:

a chamber wall defining an inner volume within the process chamber, wherein the inner volume includes a processing volume and a non-processing volume;

a sputtering target disposed in an upper section of the inner volume;

a substrate support having a support surface to support a substrate below the sputtering target;

a sealing apparatus coupled to the substrate support and configured to fluidly isolate the processing volume from the non-processing volume when the substrate support is in a processing position; and a process kit, comprising:

an annular adapter disposed atop the chamber wall and having a first annular channel and a second annular channel;

a lower shield having an outwardly extending collar disposed atop a portion of the annular adapter and adjacent the first annular channel to form a first annular plenum, wherein the lower shield includes a plurality of through holes formed through the collar to fluidly couple the first annular plenum to the processing volume; and an upper shield having an upper portion disposed atop the outwardly extending collar and a lower portion extending downward from the upper portion, wherein the upper portion includes a third annular channel formed in an outer surface of the upper portion and disposed adjacent the second annular channel to form a second annular plenum, and wherein the upper portion is spaced apart from the sputtering target to form a tortuous path between the upper portion and the sputtering target fluidly coupling the second annular plenum to the processing volume.

12. The process chamber of claim 11, wherein the sealing apparatus comprises:

a ring coupled to a bottom surface of the substrate support;

a first annular bracket;

a first bellows coupled to the ring at a first end and to a radially inward portion of the first annular bracket at a second end opposite the first end;

a second annular bracket;

a second bellows coupled to a radially outward portion of the first annular bracket at a third end and to the second annular bracket at a fourth end opposite the third end; and a base plate having coupled to the substrate support at a center of the base plate and to the radially inward portion of the first annular bracket at a radially outward portion of the base plate on a side of the first annular bracket opposite the first bellows, wherein, in the processing position of the substrate support, the second bellows is in a compressed state and an upper surface of a radially outward portion of the second annular bracket abuts against a lower surface of the lower shield, and wherein, in a non-processing position of the substrate support, the second bellows is in an uncompressed state and the upper surface of the second annular bracket is spaced apart from the lower surface of the of the lower shield.

13. The process chamber of claim 11, wherein the process kit further comprises:

a cover ring disposed atop an upwardly extending lip of the lower shield; and a deposition ring disposed beneath the cover ring.

14. The process chamber of claim 11, further comprising:

a gas supply coupled to the first annular plenum to supply one or more process gases to the processing volume; and a pump coupled to the second annular plenum to evacuate the processing volume.

15. The process chamber of claim 11, further comprising:

a first pressure monitoring device coupled to the first annular plenum to monitor a first pressure within the first annular plenum; and a second pressure monitoring device coupled to the second annular plenum to monitor a second pressure within the second annular plenum.

16. A process chamber, comprising:

a chamber wall defining an inner volume within the process chamber;

a first substrate support having a first support surface and a second substrate support having a second support surface each disposed in the inner volume, wherein the inner volume includes a first processing volume disposed above the first substrate support and a first non-processing volume disposed at least partially below the first support surface, wherein the inner volume includes a second processing volume disposed above the second substrate support and a second non-processing volume disposed at least partially below the second support surface, and wherein the first non-processing volume and the second non-processing volume together form a common volume;

a first gas supply plenum fluidly coupled to the first processing volume via a first gas supply channel disposed above the first support surface;

a second gas supply plenum fluidly coupled to second the processing volume via a second gas supply channel disposed above the second support surface;

a first pumping plenum fluidly coupled to the first processing volume via a first exhaust channel disposed above the first support surface;

a second pumping plenum fluidly coupled to the second processing volume via a second exhaust channel disposed above the second support surface;

a first sealing apparatus configured to fluidly isolate the first processing volume from the common volume when the first substrate support is in a processing position, wherein the first processing volume and the common volume are fluidly coupled when the first substrate support is in a non-processing position;

a second sealing apparatus configured to fluidly isolate the second processing volume from the common volume when the second substrate support is in a processing position, wherein the second processing volume and the common volume are fluidly coupled when the second substrate support is in a non-processing position; and a robotic arm disposed completely in the common volume and configured to receive substrates from outside of the process chamber through an opening in the chamber wall.

17. The process chamber of claim 16, further comprising:

a first gas supply coupled to the first gas supply plenum to supply one or more process gases to the first processing volume; and a second gas supply coupled to the second gas supply plenum to supply one or more process gases to the second processing volume independent of the first gas supply.

* * * * *